United States Patent [19]

Tanaka et al.

[11] Patent Number: 5,019,519

[45] Date of Patent: May 28, 1991

[54] METHOD FOR THE MANUFACTURE OF OPTICAL SEMICONDUCTOR DEVICE

[75] Inventors: Hideaki Tanaka; Shigeyuki Akiba; Masatoshi Suzuki, all of Tokyo; Katsuyuki Utaka, Musashino, all of Japan

[73] Assignee: Kokusai Denshin Denwa Kabushiki Kaisha, Tokyo, Japan

[21] Appl. No.: 316,865

[22] Filed: Feb. 28, 1989

[30] Foreign Application Priority Data

Mar. 11, 1988 [JP] Japan .................................. 63-56248

[51] Int. Cl.$^5$ .......................................... H01L 21/265
[52] U.S. Cl. .......................................... 437/22; 437/5; 437/129; 437/130; 437/155; 437/247; 357/19; 148/DIG. 84
[58] Field of Search .................... 437/22, 129, 130, 16, 437/155, 247, 5; 357/16, 17, 18, 19; 148/DIG. 84

[56] References Cited

U.S. PATENT DOCUMENTS

| 3,959,038 | 5/1976 | Gutierrez et al. | 437/22 |
| 4,213,808 | 7/1980 | Thompson et al. | 437/129 |
| 4,476,563 | 10/1984 | Ruyven | 357/17 |
| 4,679,305 | 7/1987 | Morizuka | 18/DIG. 84 |
| 4,731,340 | 5/1988 | Chang et al. | 437/22 |
| 4,811,352 | 3/1989 | Suzuki et al. | 357/17 |

FOREIGN PATENT DOCUMENTS

| 0032174 | 2/1984 | Japan | 437/22 |
| 0114274 | 5/1988 | Japan | 437/5 |

Primary Examiner—Brian E. Hearn
Assistant Examiner—Tom Thomas
Attorney, Agent, or Firm—Emmanuel J. Lobato; Robert E. Burns

[57] ABSTRACT

An optical semiconductor device manufacturing method is disclosed which involves an ion implantation step of implanting ions into a compound semiconductor wafer through an ion implantation mask and an annealing step of activating atoms in the compound semiconductor wafer through an annealing mask film. The ion implantation step and the annealing step are performed in succession after laminating mono- or multi-layered compound semiconductor layers as the ion implantation mask and the annealing mask film on the compound semiconductor wafer.

3 Claims, 7 Drawing Sheets

METHOD FOR THE MANUFACTURE OF OPTICAL SEMICONDUCTOR DEVICE

BACKGROUND OF THE INVENTION

The present invention relates to a method for manufacturing a semiconductor device which involves ion implantation and annealing steps for use in the manufacture of optical semiconductor devices.

Ion implantation is one possible means for changing a desired conductivity type to a compound semiconductor layer or providing therein a semi-insulating region. The ion implantation method is to implant ions of zinc, beryllium, or the like into a crystal-grown wafer. Since the ion implantation usually destroys crystals of the wafer, the ion implantation step must be followed by an annealing step for recovering the damage of crystals by heating the ion-implanted wafer.

The steps heretofore employed for implanting ions into and annealing an optical semiconductor encounter difficulty in precise control of the ion-implanted region and, in addition, have the defect of difficulty in selecting the material of the protective film or the necessity of using a special annealing equipment.

SUMMARY OF THE INVENTION

An object of the present invention is to provide a method for manufacturing an optical semiconductor device which allows ease in precise ion implantation into a desired region of an optical semiconductor and in annealing the ion-implanted semiconductor.

According to an aspect of the present invention, in a method for manufacturing an optical semiconductor device which involves an ion implantation step of implanting ions into a compound semiconductor wafer through an ion implantation mask and an annealing step of activating atoms in the compound semiconductor wafer through annealing mask film, the ion implantation step and the annealing steps are performed in succession after the growing of mono- or multi-layered compound semiconductor layers as the ion implantation mask and the annealing mask film on the compound semiconductor wafer.

According to another aspect of the present invention, in a method for manufacturing an optical semiconductor device which involves an ion implantation step of implanting ions into a compound semiconductor wafer through an ion implantation mask and an annealing step of activating atoms in the compound semiconductor wafer through an annealing mask film, the ion implantation step and the annealing step are performed in succession after growing mono- or multi-layered compound semiconductor layers as the ion implantation mask and the annealing mask film on the compound semiconductor wafer and then forming a thin metal film and an insulating film or at least the thin metal film on the compound semiconductor layer which will ultimately serve as the ion implantation mask.

According to another aspect of the present invention, in a method for manufacturing an optical semiconductor device which involves an ion implantation step of implanting ions into a compound semiconductor wafer through an ion implantation mask and an annealing step of activating atoms in the compound semiconductor wafer with an annealing mask film, the compound semiconductor wafer being composed of an optical waveguide layer and a plurality of clad layers smaller in energy gap than the optical waveguide layer and etched into a mesa-like form through an etching mask, a buried layer buried in the side of the mesa-like region, and at least one semiconductor layer grown on the optical waveguide, the ion implantation step and the annealing step are performed in succession after a step of forming, by crystal growth, at least one high carrier concentration semiconductor layer on the buried layer to diffuse an impurity dopant of the high carrier concentration semiconductor layer into the buried layer so that the high carrier concentration semiconductor layer extends down to the top of the optical waveguide and a step of growing mono- or multi-layered compound semiconductor layers as the ion implantation mask and the annealing mask film on the compound semiconductor wafer and then forming a thin metal film and an insulating film or at least the thin metal film on the compound semiconductor layer which will ultimately serve as the ion implantation mask.

BRIEF DESCRIPTION OF THE DRAWINGS

The present invention will be described in detail below in comparison with prior art with reference to accompanying drawings, in which.

DETAILED DESCRIPTION

To make differences between prior art and the present invention clear, examples of prior art will first be described.

Figure 1A:
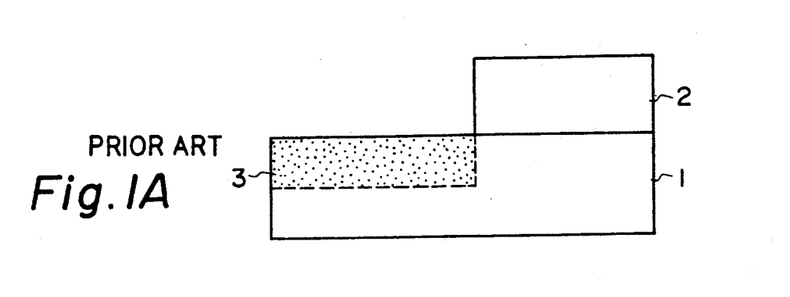
FIGS. 1A to 1C are sectional views explanatory of a conventional ion implantation step.
Figure 1B:
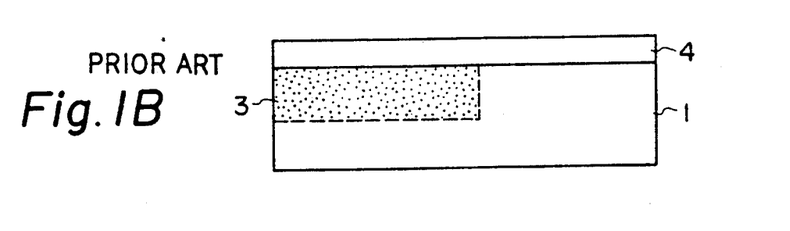
Figure 1C:
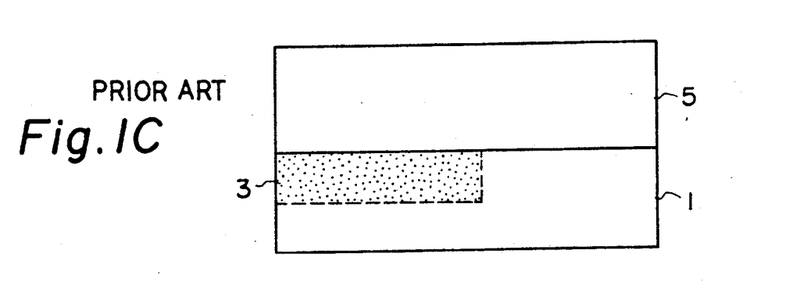

FIGS. 1A to 1C are diagrams showing conventional steps for ion implantation into a desired region of an optical semiconductor and annealing it. The first step is to implant ions into a desired region of a wafer 1, as indicated by 3, after forming on the wafer 1 a film of gold, tungsten, molybdenum or similar material as a mask 2 for preventing the implantation of the ions into other regions, as shown in FIG. 1A.

Next, the wafer is annealed for recovering the damage of crystals after removing the ion implantation mask 2. In this instance, in order to prevent external diffusion of implanted atoms and dissociation of constituent elements of the wafer, a protective film 4 as of $SiO_2$, $Si_3N_4$, AlN, or the like is formed on the wafer surface prior to annealing as shown in FIG. 1B, or the wafer is annealed in an atmosphere 5 of a constituent element of high vapor pressure, for example, in a $PH_3$ atmosphere when the wafer is made of InP, or in $AsH_3$ atmosphere when the wafer is made of GaAs, as depicted in FIG. 1C.

However, in case of etching the film of gold, tungsten, molybdenum or the like into the ion implantation mask 2 of a desired pattern, its edges cannot be formed sharp, and consequently, it is difficult to precisely control the ion-implanted region. Further, in the case of FIG. 1B, carriers abnormally increase or decrease in the surface of the wafer 1 in accordance with the material and quality of the annealing mask film 4. In the case of FIG. 1C, special annealing equipment is needed for using a dangerous gas such as $PH_3$, $AsH_3$ or the like.

With reference to the accompanying drawings, the present invention will hereinafter be described in detail.

(Embodiment 1)

FIGS. 2A through 2E show a sequence of steps involved in the manufacture of a junction type FET according to an embodiment of the present invention. The manufacturing steps will be described in the order of drawing number.

Figure 2A:
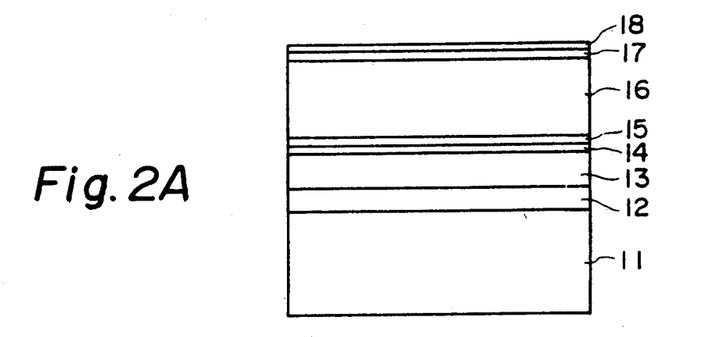
FIGS. 2A to 2E are sectional views explanatory of steps involved in the manufacture of a junction FET according to an first embodiment of the present invention.

An $n^-$-InGaAs buffer layer 12, an n-InGaAs active layer 13 (hereinafter referred to as the "n-InGaAs layer 13"), an $n^-$-InP layer 14 and $n^-$-InGaAs layer 15 which form an annealing protective film, and an ion implantation mask $n^-$InP layer 16 are grown one after another, by a metal organic vapor phase epitaxial growth method or molecular beam epitaxial growth method, on a semi-insulating InP substrate 11 of the <100> crystal direction. An $Si_3N_4$ etching mask film 17 is deposited on the $n^-$InP layer 16 and is coated with a photoresist film 18.

The present invention is characterized in that the n-InGaAs layer 13, into which ions are implanted, underlies the annealing mask films 14 and 15, which are compound semiconductor layers, and the ion implantation mask 16. Incidentally, the annealing mask films 14 and 15 and the ion implantation mask 16 may also be formed of other materials so long as they are semiconductor layers which have thicknesses greater than the depth of ion implantation into the n-InGaAs layer 13 and are coherent in lattice with the layer 13.

Figure 2B:
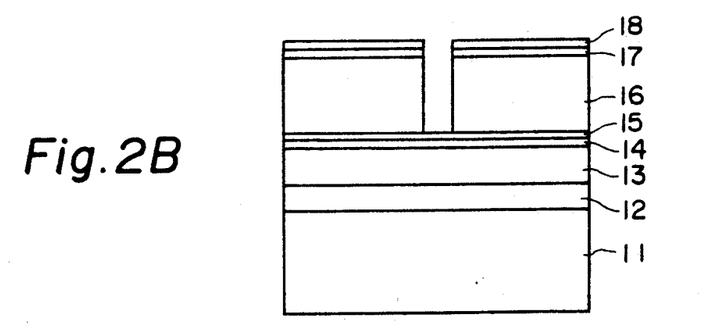

The photoresist film 18 is exposed to a pattern and the latent image is developed, transferring the pattern to the $Si_3N_4$ film 17. The $n^-$InP ion implantation mask layer 16 is selectively etched away in a vertical direction with a mixed solution of hydrochloric acid and phosphoric acid in the ratio of 1:3, using the $Si_3N_4$ film 14 as an etching mask. In case of forming a mesa in the <011> crystal direction, this mixed solution vertically etches the ion implantation mask but does not etch the $n^-$-InGaAs layer 15.

In this way, the present invention permits vertical etching of the InP ion implantation mask layer 16 with such a selected etchant.

Figure 2C:
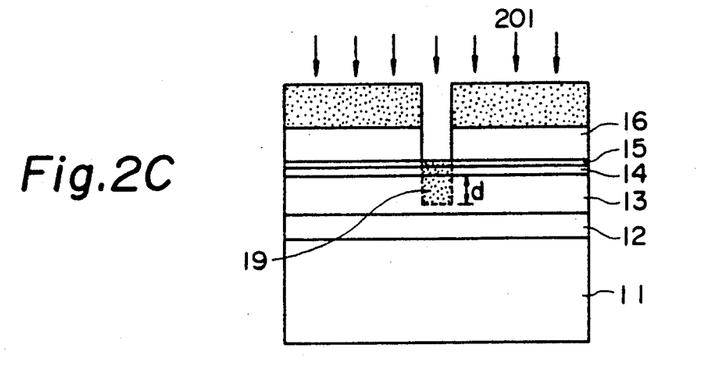

The photoresist film 18 is removed and the $Si_3N_4$ film 17 is entirely etched away. This is followed by an ion implantation step in which Be ions 201 are injected to form an ion-implanted region 19 which will ultimately serve as a channel. In this instance, the plurality of compound semiconductor layers 14, 15 and 16 function as an ion implantation mask. The depth of the ion-implanted region 19 is d [cm] from the surface of the n-InGaAs layer 13. Next, the substrate assembly is annealed in a nitrogen gas atmosphere. In this annealing step the compound semiconductor layers 14 and 15 serve as an annealing mask.

Figure 2D:
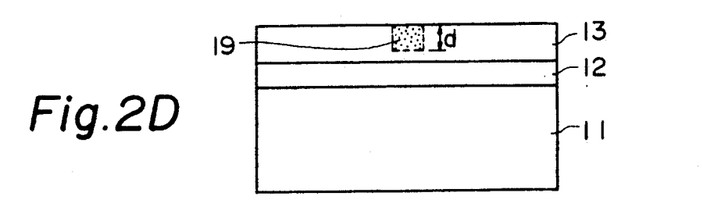

The $n^-$-InP layer 16 is etched away with, for example, a mixed solution of hydrochloric and phosphoric acids in the ration of 1:3; the $n^-$-InGaAs layer 15 is etched away with, for example, a mixed solution of sulfuric acid, a hydrogen peroxide solution and water in the ratio of 1:8:1; and the $n^-$-InP layer 14 is etched away with, for instance, a mixed solution of hydrochloric and phosphoric acids in the ratio of 1:3.

Figure 2E:
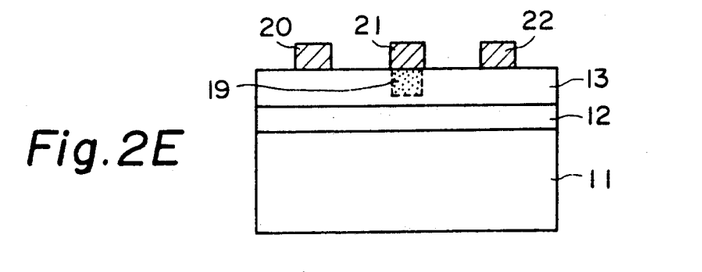

Source, gate and drain electrodes 20, 21 and 22 are formed in position, thus obtaining a junction type FET.

As described above, according to the present invention, the ion implantation mask 16 and the annealing mask films 14 and 15 can be formed simultaneously with the growth of crystals for the formation of the device, and consequently, no particular steps are needed for forming the ion implantation mask and the annealing mask film, or no special annealing device is required unlike in the prior art. This permits simplification of the entire manufacturing process. Furthermore, the ion implantation mask 16 is formed of a compound semiconductor, and hence can be etched vertically; this allows precise control of the ion-implanted region. Moreover, since the distribution of ion-implanted atoms is a Gaussian distribution in the direction of depth of the wafer, the number of implanted atoms in the wafer surface is small, but since the wafer surface is removed by etching after annealing, the surface region in which the number of implanted atoms is small can be removed. Besides, even if implanted atoms is small can be removed. Besides, since the constituent elements of high vapor pressure are not dissociated between the wafer surface and the annealing mask film unlike in the prior art because of preparation of the annealing mask film by a compound semiconductor layer, an abnormal increase or decrease in the number of carriers will not occur in the wafer surface.

(Embodiment 2)

Next, a description will be given of a second embodiment of the present invention in which at least one of a metal thin film of a large energy loss and an insulating film is laminated on the ion implantation mask 16 and the annealing mask films 14 and 15 so as to more effectively block the ions during the ion implantation. Incidentally, this embodiment will be described in combination with an "Optical Semiconductor Device Manufacturing Method" (a manufacturing method in which during selective growth and impurity dopant of a high carrier concentration semiconductor layer is diffused into a buried layer formed of a low carrier concentration semiconductor layer, instead of using an $SiO_2$ film which is an etching mask) on which a patent application was filed by the same inventor even date herewith.

Figure 3:
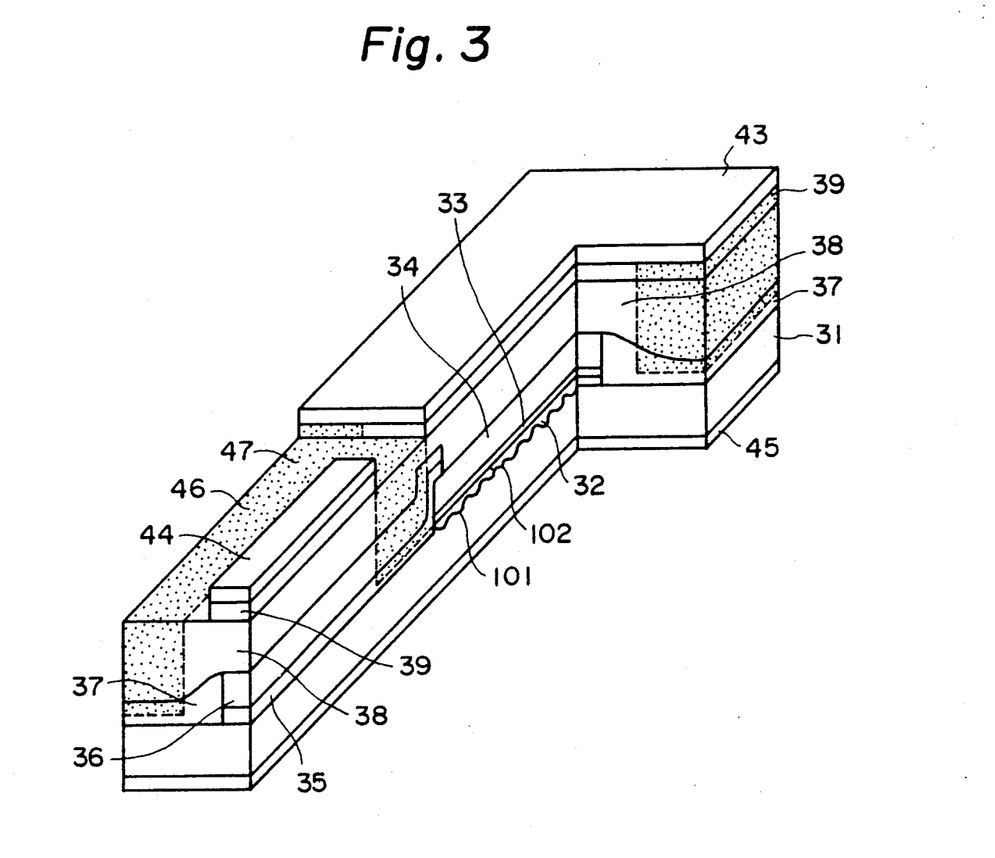
FIG. 3 is a perspective view, partly in section, explanatory of an optical semiconductor device in which a DFB laser and a modulation element are integrated on the same substrate according to the present invention.

FIG. 3 is a schematic sectional view of an optical semiconductor device, for explaining the manufacturing method of the present invention. This is an optical semiconductor device in which a light emitting element, i.e. a laser (hereinafter referred to as the "DFB laser") having a light emitting waveguide of a periodically irregular structure and an optical modulation element are integrated on the same substrate.

The laser region has, on an n-type InP substrate 31, an InGaAsP optical waveguide layer 32 (emitting light of a wavelength about 1.3 μm) which serves as a light emitting waveguide and an InGaAsP light emitting layer 33 (emitting light of a wavelength of about 1.55 μm), and the light waveguide has a structure in which a p-type InP layer 34 is buried in a low carrier concentration n-type InP layer 37. A grating (or diffraction grating) 101 formed by a periodic irregularities is formed at the boundary between the n-type InP substrate 31 and the InGaAsP optical waveguide layer 32, and by injecting a current into the light emitting layer 33, the laser will oscillate at a single wavelength in the vicinity of the Bragg wavelength which is determined by the period and refractive index of the irregularity. With a view to improving the single wavelength selectivity, a quarter-wavelength shift point 102 is provided in the grating 101. The output of the DFB laser is guided to an InGaAsP modulation waveguide layer 35 which is a modulation waveguide layer connected to the light emitting waveguide (32, 33).

On the other hand, a modulation region has a structure in which the modulation waveguide having the modulation waveguide layer 35 and a p-type InP layer 36 is buried in the n-type InP layer 37 as is the case with the DFB laser. As in Embodiment 1, a high carrier concentration p-type InP layer 38 overlies the p-type InP layer 34 and the clad layer 36. Reference numeral 39 indicates a p-type InGaAsP contact layer, 43 a p-side electrode of the laser region, 44 a p-side electrode of the modulation region, and 45 an n-side electrode common to the laser region and the modulation region. Beside the light emitting waveguide layer 32 of the DFB laser region and the optical waveguide (35, 36) of the modulation region there is provided a semi-insulating region 46 formed by implanting ions of oxygen, proton, argon, or the like which form a deep level and presents a semi-insulating property. The laser region and the modulation region are electrically isolated by an ion-implanted semi-insulating region 47 formed therebetween.

FIGS. 4A to 4H illustrate in sequence of steps employed in the manufacture of the optical semiconductor device in which the laser region and the modulation region are integrated on the same substrate, in accordance with a second embodiment of the present invention.

Figure 4A:
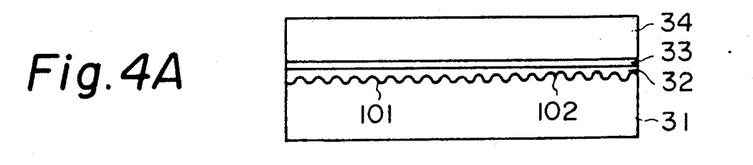
FIGS. 4A to 4H are sectional views explanatory of manufacturing steps of the optical semiconductor device according to a second embodiment of the present invention.

The InGaAsP waveguide layer 32, the InGaAsP light emitting layer 33 and the p-type InP layer 34 are grown one after another, with the vapor or liquid phase epitaxial growth method, on the n-type InP substrate 31 having formed therein the grating 101 with the λ/4 shift point 102.

Figure 4B:
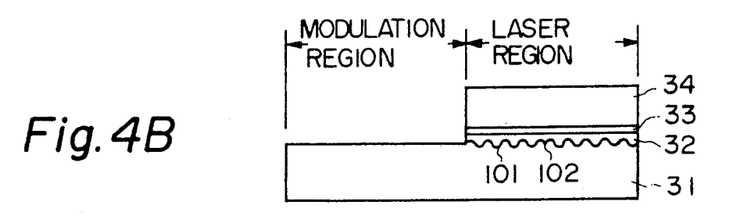

The wafer portion of the substrate 31 and the layers 32, 33 and 34 are selectively etched away to provide the modulation region where the optical modulation element will ultimately be formed.

Figure 4C:
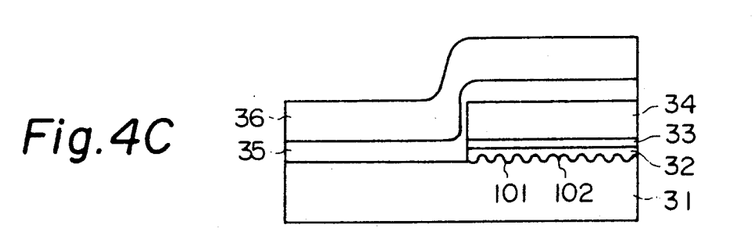

The InGaAsP modulation waveguide layer 35 and the p-type InP layer 36 are grown all over the wafer assembly.

Figure 4D:
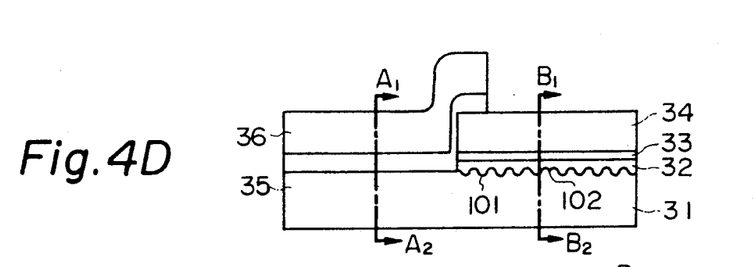

The grown layers on the light emitting waveguide layer 33 are removed, leaving thereon the modulation waveguide 35 near the boundary between the DFB laser region and the modulation region. Then the DFB laser region and the modulation region are selectively etched away to form a mesa as a whole. The reason for which the modulation waveguide 35 is left remaining on the light emitting waveguide layer 33 is to increasing the efficiency of coupling between the DFB laser region and the modulation region as set forth in a patent application (Japan. Pat. Appln. No. 17252/87) filed by the same applicant.

Figure 5A:
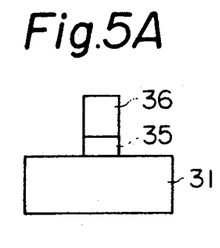
FIGS. 5A and 5B are sectional view taken on the lines A1-A2 and B1-B2 in FIG. 4D, respectively.
Figure 5B:
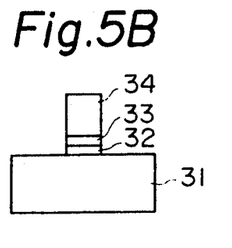

FIGS. 5A and 5B are sectional views taken on the lines A1-A2 and B1-B2 in FIG. 4D, respectively, FIG. 5A showing the mesa-shaped optical waveguide in the modulation region and FIG. 5B the light emitting waveguide in the laser region. The steps described above are identical with those employed in the prior art.

In this step no selective growth process using an insulation film is employed as in the case of the patent application filed even date herewith, but instead the vapor phase epitaxial growth process is employed, by which a low carrier concentration n-type InP layer 37 is grown all over the wafer surface including the DFB laser region and the modulation region (as indicated by the broken line in FIG. 6) and then a zinc-doped p-type InP layer 38 is grown as a high carrier concentration semiconductor layer. At this time, zinc which is an impurity dopant in the high carrier concentration p-type InP layer 38 diffuses into the low carrier concentration n-type InP layer 37 and down to the p-type InP layers 34 and 36 which are upper clad layers at the top of the mesa (as indicated by the solid lines in FIG. 6), with the result that the p-type regions are interconnected. Accordingly, the selective growth of the above-mentioned layers can equivalently be achieved without using insulating films as of $SiO_2$, which is characteristic of the present invention and the invention described in the afore-mentioned patent application filed even date herewith.

Figure 4E:
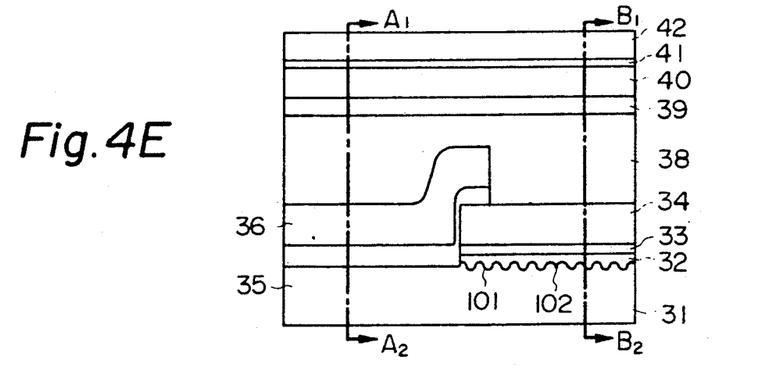
Figure 6A:
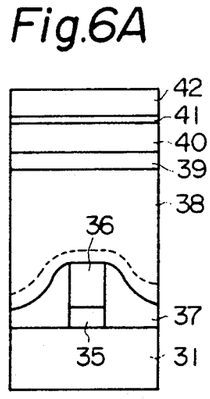
FIGS. 6A and 6B are sectional views taken on the lines A1-A2 and B1-B2 in FIG. 4E.
Figure 6B:
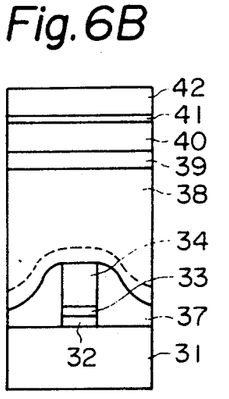

FIGS. 6A and 6B are sectional views taken on the lines A1-A2 and B1-B2 in FIG. 4E, respectively, FIG. 6A showing the modulation region and FIG. 6B the laser region.

The formation of a zinc-doped $p^+$-InP GaAsP layer 39 as an electrode contact layer is followed by the growth of a $p^+$-InP layer 40 serving both as an ion implantation mask and as an annealing mask film which is a first feature of the present invention.

Next, An $SiO_2$ etching mask film 41 which is an insulating film is deposited on the $p^+$-InP layer 40, which is deposited with a metal thin film (a non-compound semiconductor film) of a large energy loss, for example, a thin film 42 of gold so as to more effectively block ions, which is a second feature of the present invention. The $SiO_2$ film 41 is to prevent the $p^+$-InP layer 40 from being attacked by an etchant for the gold thin film 42. Although in this embodiment the insulating film 41 and the metal thin film 42 are deposited on the $p^+$-InP layer 40 which serves both as an ion implantation mask and as an annealing mask film, the metal thin film 42 needs only to be provided.

The metal thin film 42, the $SiO_2$ etching mask film 41 and the $p^+$-InP layer 40 are selectively etched away for implanting ions into the side of the light emitting waveguide layer 33 of the laser region, the side of the optical modulation waveguide layer 35 and the coupling portion between the laser region and the modulation region.

By implanting, for example, proton ions into the above-mentioned portions, the semi-insulating regions 46 and 47 are formed.

Figure 4F:
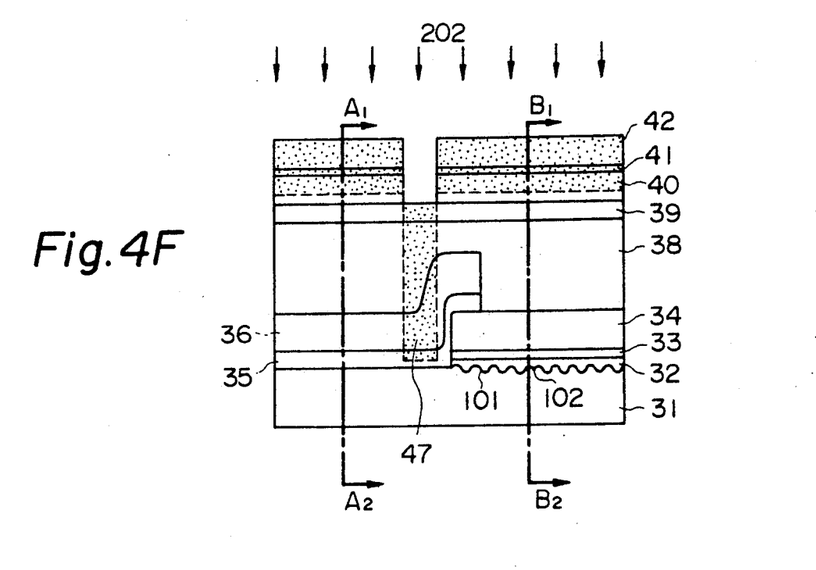
Figure 4G:
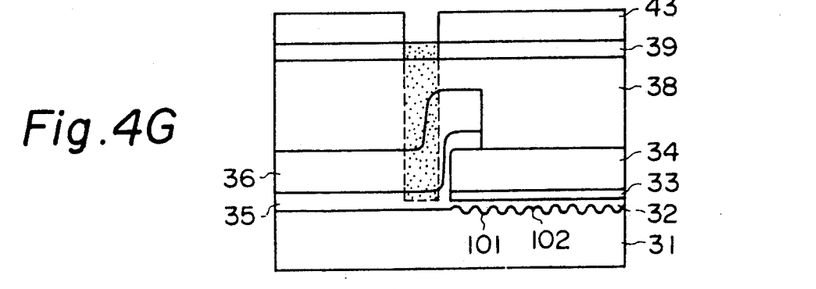
Figure 4H:
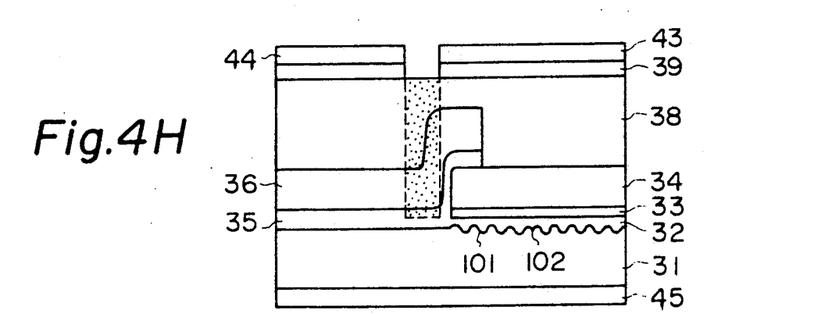
Figures 7A, 7B:
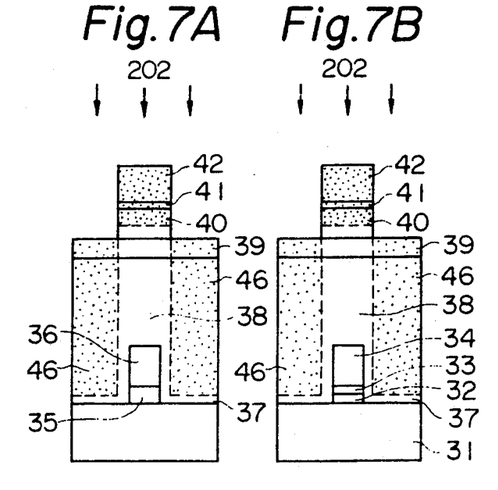
FIGS. 7A and 7B are sectional views taken on the lines A1-A2 and B1-B2 in FIG. 4F.

FIGS. 7A and 7B are sectional views taken on the lines A1-A2 and B1-B2 in FIG. 4F, respectively, FIG. 7A showing the modulation region and FIG. 7B the laser region.

The proton ions thus implanted do not diffuse deep into the portion covered with the metal thin film 42 and the proton ions having passed through metal thin film 42 are also substantially completely blocked by the $SiO_2$ film 41 and the $p^+$-InP layer 40.

The $SiO_2$ etching mask film 41 is etched away with a mixed solution of, for example, hydrofluoric acid an ammonium fluoride in the ratio of 3:20, followed by removal of the metal thin film 42 through a lift-off method. Next, the substate assembly is annealed in a nitrogen atmosphere. In this case, the p+-InGaAsP layer 39 and the p+-InP layer 40 act as an annealing mask.

After the p+-InP layer 40 is etched away, that region of the p+-InGaAsP layer 39 into which the proton ions were implanted is removed by etching, and the p-side electrode 43 of the DFB laser, the p-side electrode 44 of the optical modulation element and the common n-side electrode 45 are formed.

While the above embodiments have been use semiconductors of the inP/InGaAs series and the InP/InGaAsP series, it is also possible to employ semiconductor materials of the AlGaAs/GaAs, the AlInGaAs/InP and similar series.

As described above in detail, according to the present invention, since compound semiconductors are used for the ion implantation mask and the annealing mask, they can be formed simultaneously with the crystal growth for the device. In other words, the present invention does not involves any particular steps of forming the ion implantation mask and the annealing mask nor does it necessite the use of a special annealing device, and consequently, the manufacturing process simplified. Moreover, since the ion implantation mask formed of the compound semiconductor can be etched vertically, the ion-implanted region can precisely controlled. Furthermore, since the distribution of ion-implanted atoms is a Gaussian distribution in the direction of depth of the wafer, the number of implanted atoms in the wafer surface is small, but the region in which the number of atoms is small can be removed, because the surface region of the wafer is etched way after annealing. Since the constituent elements of high vapor pressure are not dissociated between the wafer surface and the annealing mask film unlike the prior art because of preparation of the annealing mask film by a compound semiconductor layer, an abnormal increase or decrease in the number of carriers will not occur in the wafer surface.

By the combined use of the compound semiconductor ion implantation mask such as the gold thin film 42 in addition to the above-described manufacturing method, implanted ions are completely blocked by the mask portions.

Besides, an optical semiconductor device of few impurities and lattice defects can be manufactured by selective growth of required layers without using $SiO_2$ and like insulating films as proposed by the same inventors in the afore-mentioned patent application filed even date herewith.

Thus, the present invention permits easy fabrication of high performance electronic devices and optical devices such as FET's and integrated optical modulation elements utilizing the ion implantation technique, and these devices can be applied to ultra-high speed computers, ultra-high speed fiber optic communications, etc. The present invention is therefore of great utility in practical use.

What we claim is:

1. An optical semiconductor device manufacturing method comprising an ion implantation step of implanting ions into a compound semiconductor wafer through using an ion implantation mask and subsequently effecting an annealing step of activating atoms in the compound semiconductor wafer with an annealing mask film existing on the wafer, characterized in:
   that the ion implantation step and the annealing step are performed in succession after growing mono- or multi-layered compound semiconductor layers defining the ion implantation mask and defining the annealing mask film on the compound semiconductor wafer, and said implanting of ions into the compound semiconductor wafer being effected through the annealing mask film using the ion implantation mask.

2. An optical semiconductor device manufacturing method comprising an ion implantation step of implanting ions into a compound semiconductor wafer using an ion implantation mask and subsequently effecting an annealing step of activating atoms in the compound semiconductor wafer with an annealing mask film existing on the compound semiconductor wafer, characterized in:
   that the ion implantation step and the annealing step are performed in succession after growing mono- or multi-layered compound semiconductor layers defining the ion implantation mask and defining the ion implantation mask and defining the annealing mask film on the compound semiconductor wafer and then forming a metal thin film and an insulating film or forming at least the metal thin film on the ion implantation mask, and said implantation of ions into the compound semiconductor wafer being effected through the annealing mask film using the ion implantation mask and at least the metal thin film.

3. An optical semiconductor device manufacturing method comprising an ion implantation step of implanting ions into a compound semiconductor wafer through an ion implantation mask and subsequently effecting an annealing step of activating atoms in the compound semiconductor wafer with an annealing mask film existing on the compound semiconductor wafer, the compound semiconductor wafer being composed of an optical waveguide formed by an optical waveguide layer and a plurality of clad layers smaller in energy gap than the optical waveguide layer and etched into a mesa-like form with an etching mask, a buried layer buried in the side of the mesa-like region, and at least one semiconductor layer grown on the buried layer and the optical waveguide, characterized in:
   that the ion implantation step and the annealing step are performed in succession after a step of forming, by crystal growth, at least one high carrier concentration semiconductor layer on the buried layer effective to diffuse an impurity dopant in the high carrier concentration semiconductor layer into the buried layer so that the high carrier concentration semiconductor layer extends down to the top of the optical waveguide and after a step of growing mono- or multi-layered compound semiconductor layers defining the ion implantation mask and defining the annealing mask film on the compound semiconductor wafer, and then forming a thin metal film and an insulating film or forming at least the thin metal film on the ion implantation mask.

* * * * *